United States Patent
Wang et al.

(10) Patent No.: US 7,834,357 B2
(45) Date of Patent: Nov. 16, 2010

(54) STRUCTURE OF THIN FILM TRANSISTOR

(75) Inventors: Yi-Kai Wang, Hsinchu (TW);
Liang-Ying Huang, Taichung County (TW); Tarng-Shiang Hu, Hsinchu (TW); Yu-Yuan Shen, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/871,153

(22) Filed: Oct. 11, 2007

(65) Prior Publication Data
US 2008/0099843 A1   May 1, 2008

(30) Foreign Application Priority Data
Oct. 26, 2006   (TW) .............................. 95139509 A

(51) Int. Cl.
*H01L 29/786* (2006.01)
(52) U.S. Cl. .................... 257/66; 257/71; 257/E29.273
(58) Field of Classification Search ................. 257/296, 257/347, E29.273, E21.414, E29.291, E29.294; 438/160, 155
See application file for complete search history.

(56) References Cited

U.S. PATENT DOCUMENTS

| | | | | |
|---|---|---|---|---|
| 6,566,172 B1 * | 5/2003 | Jackson et al. | ............... | 438/149 |
| 2004/0232495 A1 * | 11/2004 | Saito et al. | .................. | 257/382 |
| 2005/0148123 A1 * | 7/2005 | Mao-Tsum | ................. | 438/158 |
| 2006/0086979 A1 * | 4/2006 | Kim et al. | .................... | 257/347 |
| 2007/0059868 A1 * | 3/2007 | Huang et al. | ................. | 438/151 |
| 2007/0146426 A1 * | 6/2007 | Nelson et al. | ................. | 347/44 |

\* cited by examiner

*Primary Examiner*—Stephen W Smoot
(74) *Attorney, Agent, or Firm*—Jianq Chyun IP Office

(57) ABSTRACT

A structure of a thin film transistor (TFT) is provided. A substrate has a first surface and a second surface opposite to each other, in which the first surface has a patterned mask layer. A patterned first electrode layer is disposed on the second surface of the substrate and has a gate portion and a capacitor electrode portion. A patterned second electrode layer is disposed on the second surface of the substrate and has a source and a drain, in which the patterned second electrode layer is self-aligned with the patterned first electrode layer by exposing the first surface of the substrate with the patterned mask layer as a mask. An insulating layer is disposed between the patterned first electrode layer and the patterned second electrode layer.

20 Claims, 18 Drawing Sheets

US 7,834,357 B2

STRUCTURE OF THIN FILM TRANSISTOR

CROSS-REFERENCE TO RELATED APPLICATION

This application claims the priority benefit of Taiwan application Ser. No. 95139509, filed on Oct. 26, 2006. All disclosure of the Taiwan application is incorporated herein by reference.

BACKGROUND OF THE INVENTION

1. Field of Invention

The present invention relates to a method for making a thin film transistor (TFT) and a structure of the same.

2. Description of Related Art

Along with the improvement of the display technology, lighter, thinner, portable, and flexible displays attract many people, and a lot of companies are involved in the research and development activities. Organic thin film transistor (OTFT) is a TFT that an organic molecule material is used to develop for electronic products. The greatest advantage of the OTFT is that when the panel is bent, the characteristics of the transistor can still be maintained to achieve a normal display quality effect. Such application may accelerate the realization of electronic products such as flexible displays.

A plastic substrate, characterized in being transparent, light, thin, impact resisting, and flexible, is suitable for the roll to roll high production rate process. Therefore, in the application of a flexible display or logic element, it is the main trend in the future to fabricate the OTFT on a plastic substrate.

FIG. 1 is a schematic view of the circuit structure of a common liquid crystal pixel. A liquid crystal pixel at least comprises a liquid crystal capacitor $C_{CL}$, a storage capacitor $C_{st}$, and a TFT functioning as a switch. A gate of the TFT is connected to a scan line scan 1, a source is connected to a data line data 1, and a drain is connected to one end of the liquid crystal capacitor $C_{CL}$ and that of the storage capacitor $C_{st}$. Since the element structure and functions of each pixel in a pixel array are known to all, the details will not be described herein again, and only the parasitic capacitance is discussed below. In the pixel structure of FIG. 1, during the fabrication process of a plastic substrate, the water permeability and the oxygen permeability of the substrate must be improved. In addition, the soaking process of the solvent and the high temperature process during the fabrication process may cause an unstable size of the substrate, thus making an exact alignment become difficult. The above problem may raise the difficulty of the fabrication process and reduce the process yield. Particularly, the above problem may result in overlapping the source, drain, or gate during the fabrication, thus generating a parasitic effect. The parasitic effect of each region on the panel is different, so as to cause differences on picture quality. As shown in FIG. 1, usually the parasitic capacitances include the parasitic capacitance $C_{gd}$ between the gate and the drain of the transistor T, the parasitic capacitance $C_{pd1}$ between the scan line and the drain, the parasitic capacitance $C_{pg2}$ between the drain and the next data line data 2, the parasitic capacitance $C_{pd1}$ between the data line data 1 and the drain, the parasitic capacitance $C_{pg2}$ between the drain and the next scan line scan 2.

During the operation, when the TFT is turned off by a gate-off voltage provided by the scan line, the voltage on the pixel electrode may suddenly drop because of the kickback voltage $\Delta Vp$. According to the following formulae, the amplitude of the kickback voltage $\Delta Vp$ is relevant to the parasitic capacitances between the gate, the drain, the scan line, and the data line of the TFT.

$$\Delta V_p = (\Delta V_g C_{gd} + \Delta V_d C_{pd})/(C_{gd} + C_{st} + C_{LC} + C_{pd})$$

$$\Delta V_d C_{pd} << \Delta V_g C_{gd}$$

$$\Delta V_p = |V_{gate-on} - V_{gate-off}| \times |C_{gd}/C_{total}|$$

The kickback voltage may result in the flickering of the image on the LCD. As for a common display, the smaller the kickback voltage $\Delta Vp$ is, the more difficult the generation of the flickering of the frame is, and the better the display quality will be.

Generally, the voltage of a common electrode can be adjusted to reduce the kickback voltage $\Delta Vp$. However, if the alignment problem in the fabrication process is not solved to reduce the overlap between the source, drain, and gate, it remains difficult to effectively overcome the high kickback voltage caused by the parasitic capacitance effect.

Therefore, how to develop a process with preferred alignment to reduce the overlap between the source, drain, and gate and then to reduce the parasitic effect is an important issue.

SUMMARY OF THE INVENTION

Accordingly, the present invention provides a structure of a TFT, which can effectively solve the alignment problem between the source/drain and the gate, and have the advantages of making the elements have excellent characteristics and simplifying the fabrication process.

Moreover, the present invention provides a TFT structure. A substrate has a first surface and a second surface opposite to each other, in which the first surface has a patterned mask layer. A patterned first electrode layer is disposed on the second surface of the substrate and has a gate portion and a capacitor electrode portion. A patterned second electrode layer is disposed on the second surface of the substrate and has a source and a drain, in which the patterned second electrode layer is self-aligned with the patterned first electrode layer by exposing the first surface of the substrate with the patterned mask layer as a mask. An insulating layer is disposed between the patterned first electrode layer and the patterned second electrode layer.

Besides, the present invention further provides a TFT pixel structure. A substrate has a first surface and a second surface opposite to each other, in which the first surface has a patterned mask layer. A patterned first electrode layer is disposed on the second surface of the substrate and has a gate portion. A patterned second electrode layer is disposed on the second surface of the substrate and has a source and a drain, in which the patterned second electrode layer is self-aligned with the patterned first electrode layer by exposing the first surface of the substrate with the patterned mask layer as a mask. An insulating layer is disposed between the patterned first electrode layer and the patterned second electrode layer.

In order to make the aforementioned and other objectives, features, and advantages of the present invention comprehensible, preferred embodiments accompanied with Figures are described in detail below.

DESCRIPTION OF EMBODIMENTS

The present invention provides a structure of a TFT, which can be formed by following process, for example. The TFT has a plastic substrate or a flexible substrate, wherein the self-alignment in the substrate is performed to expose a source and a drain of a second electrode layer through a gate by forming a mask on the backside of the substrate and by using the backside exposure. Therefore, a self-alignment with high accuracy can be achieved, so as to reduce the influence of the parasitic effect on image quality. Moreover, the design of the gate with a comb structure can be used to increase the aspect ratio of the element, so as to increase the on-current of the element.

The method of the present invention is mainly to form a pattern definition layer, which is used for defining a gate and a capacitor, on the front side or the backside of a substrate (for example, a plastic substrate). Then, the pattern defined by the pattern definition layer is used to perform a self-alignment process, so as to form a source region and a drain region subsequently. Then, the source and the drain can be self-aligned with the gate by a backside exposure. In this manner, the overlap of the source, the drain and the gate is reduced, and the parasitic effect is alleviated.

The First Embodiment

Figure 1:
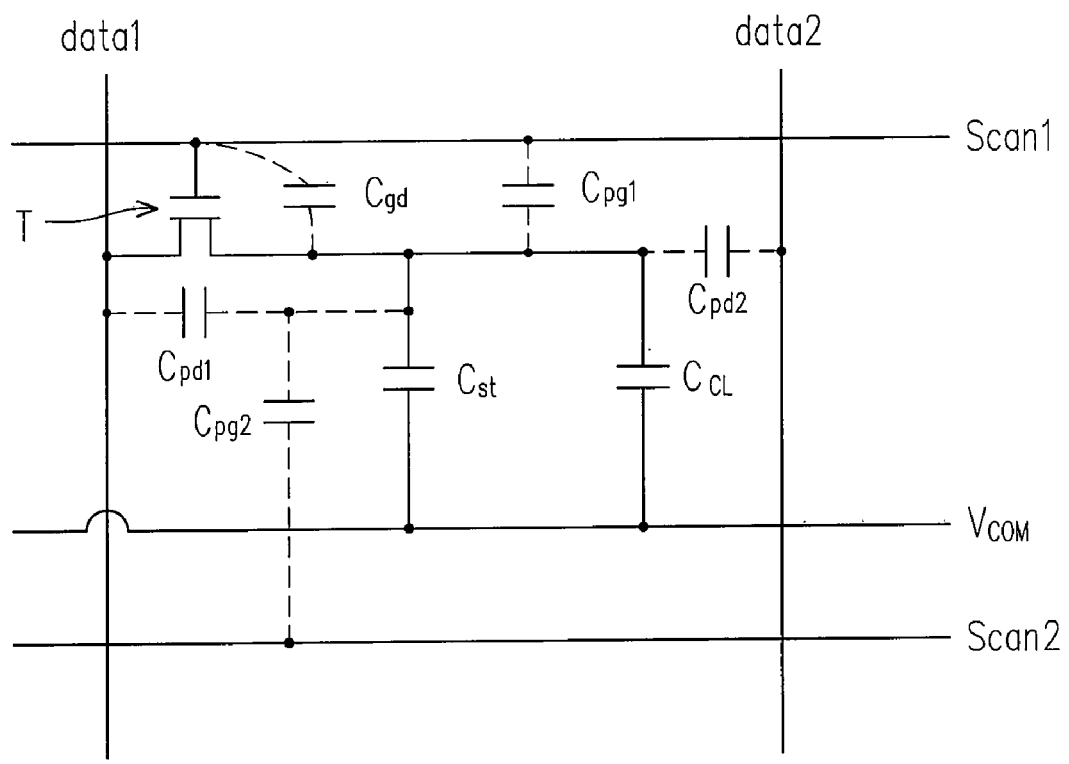
FIG. 1 is a schematic view of a circuit structure of a common liquid crystal pixel.
Figure 2A:
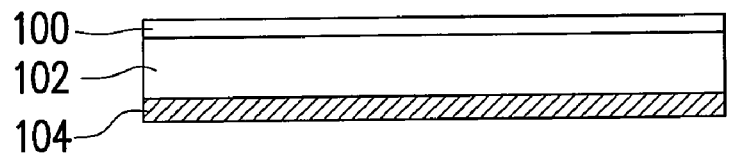
FIGS. 2A to 2N are schematic views of the fabrication flow of the TFT according to a first embodiment of the present invention.
Figure 2B:
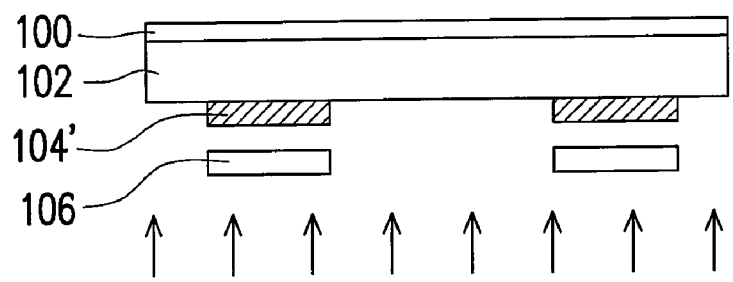
FIG. 2P is a top view of the TFT according to the first embodiment of the present invention.
Figure 2C:
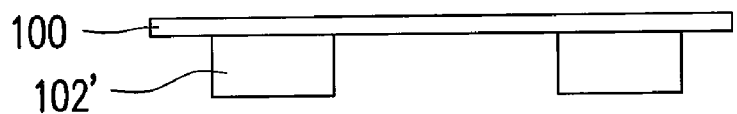
Figure 2D:
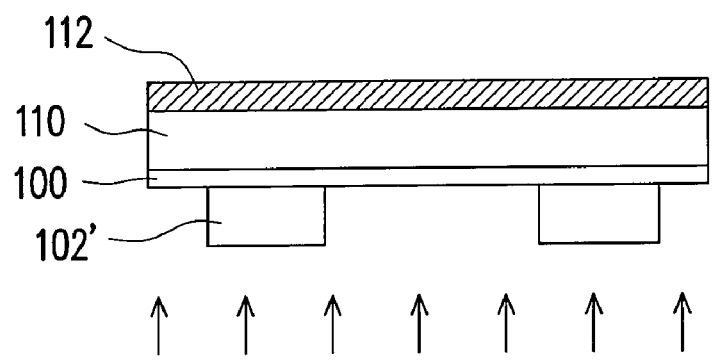
Figure 2E:
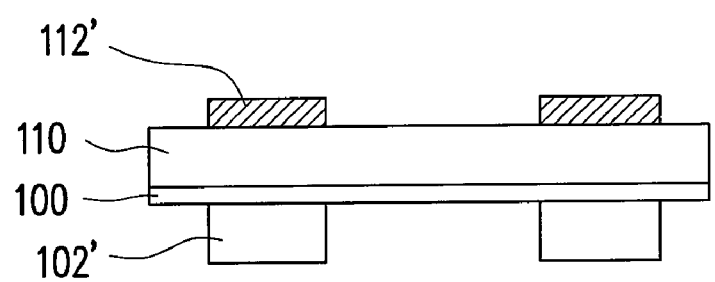
Figure 2F:
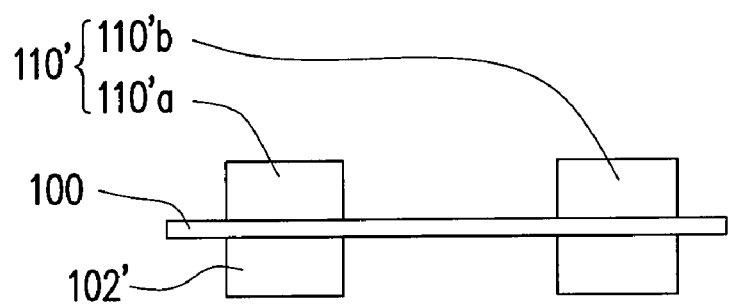
Figure 2G:
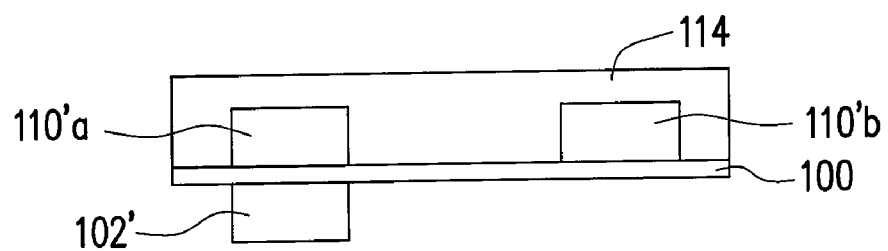
Figure 2H:
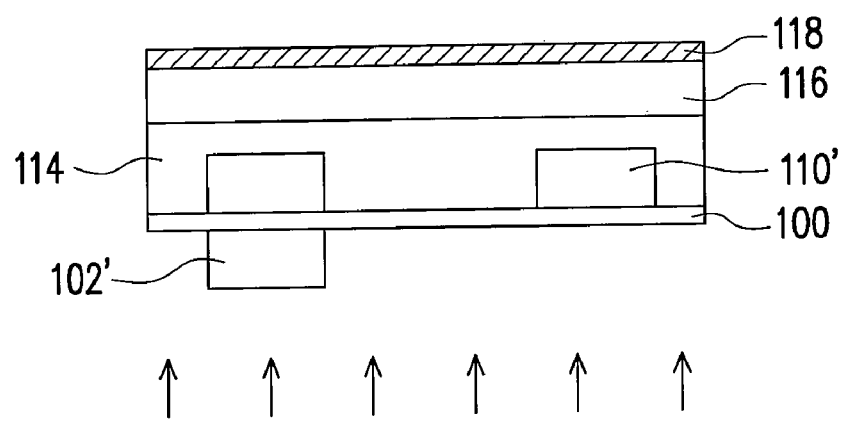
Figure 2I:
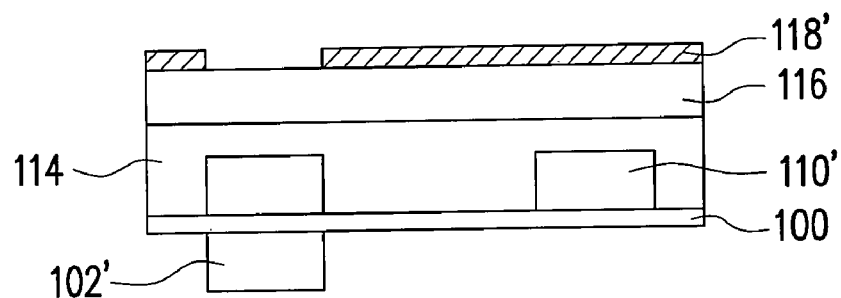
Figure 2J:
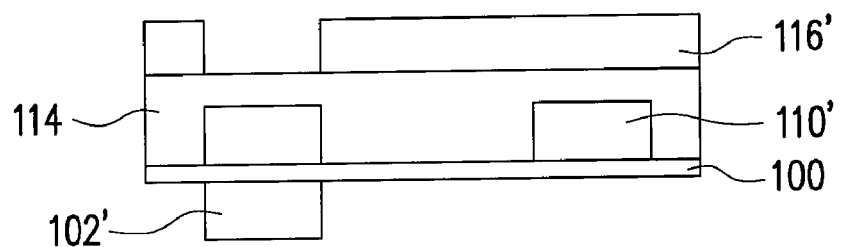
Figure 2K:
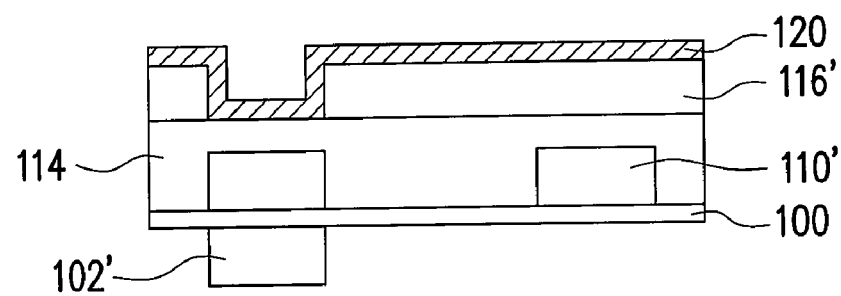
Figure 2L:
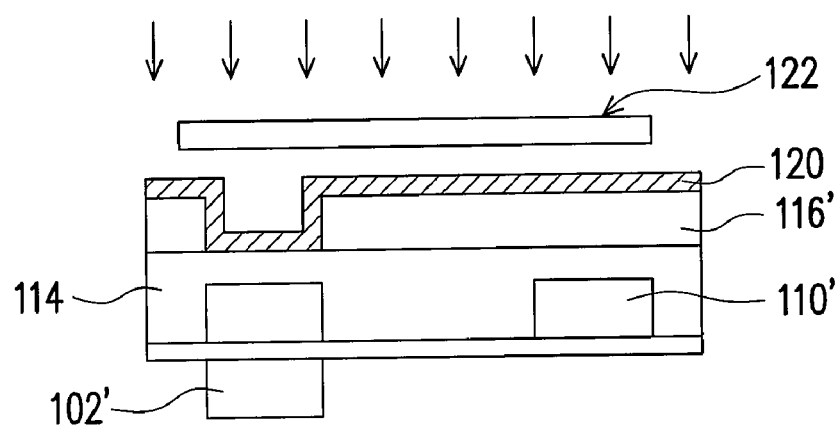
Figure 2M:
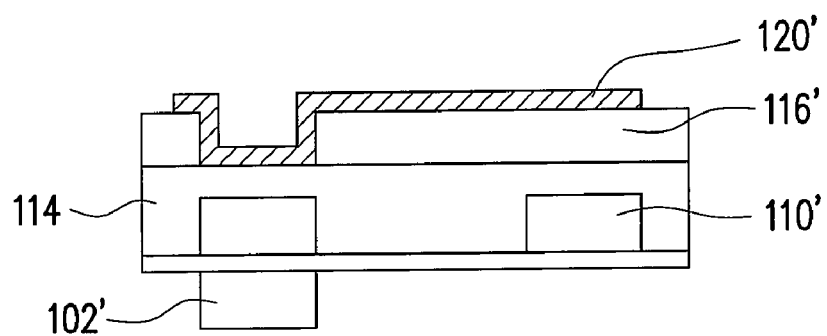
Figure 2N:
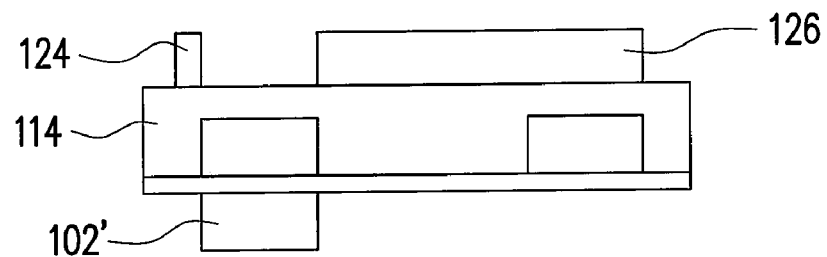
Figure 2P:
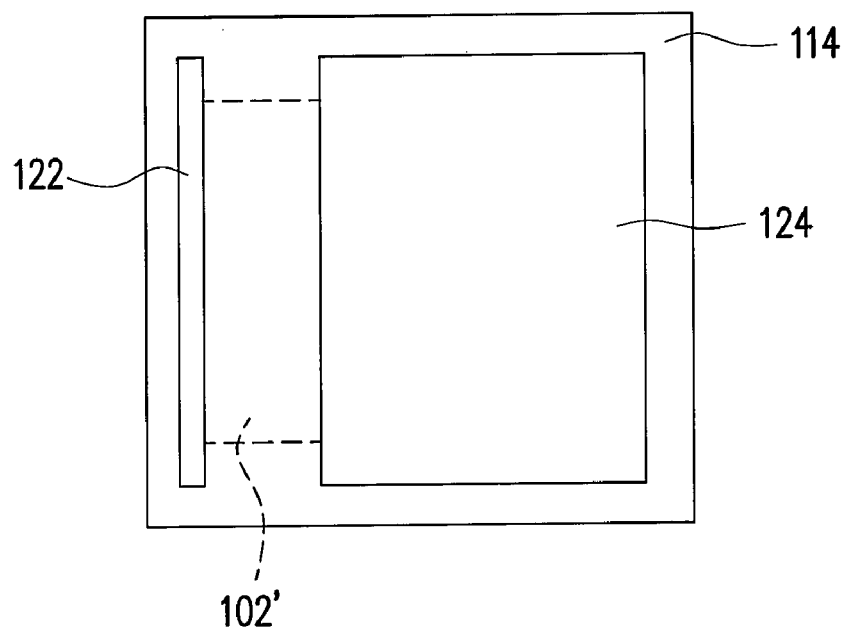

FIGS. 2A to 2N are schematic fabrication flow diagrams of the TFT according to a first embodiment of the present invention. FIG. 2P is a top view of the TFT according to the first embodiment of the present invention. As an example, the gate is formed on the backside of the substrate in the first embodiment.

As shown in FIG. 2A, a substrate 100 is provided, and a mask layer 102 is formed on the substrate 100. The substrate has a first surface used as the backside and a second surface opposite to the first surface, for example. In this embodiment, the substrate can be a plastic substrate, and the mask layer 102 is, for example, a chromium layer. Next, a photoresist layer 104 is coated on the chromium layer 102. Then, as shown in FIG. 2B, a mask 106 with gate and capacitor patterns is provided to perform a pattern transfer onto the photoresist 104, so as to form a pattern 104' of the mask 106 on the photoresist 104. Afterward, the exposed chromium layer 102 is etched to remove by using the photoresist pattern 104' as a mask, so as to form a patterned mask (chromium) layer 102' having the gate and the capacitor patterns, as shown in FIG. 2C. The above removing method can use dry etching or wet etching, which is not particularly restricted. It should be noted that using a plastic substrate as the substrate and using a chromium layer as the mask layer are only examples, and the present invention is not limited herein. For example, the substrate can be a flexible substrate, and the mask layer can be an opaque metal layer.

Next, referring to FIG. 2D, a first electrode layer 110 (M1) is formed on the substrate 100, and a photoresist 112 is coated on the first electrode layer 110. Then, the photoresist 112 is exposed by using the patterned chromium layer 102' as a mask, and the non-exposed portions are removed to form a photoresist pattern 112'. Afterward, as shown in FIG. 2E, the exposed first electrode layer 110 is removed by using the photoresist pattern 112' as a mask. Thereafter, the photoresist is removed to form a patterned first electrode layer 110' including a gate 110'$a$ and a capacitor electrode 110'$b$ as shown in FIG. 2F.

As shown in FIG. 2G, lithography or laser is used to re-define the patterned mask layer 102', so as to remove the pattern corresponding to the capacitor electrode. Moreover, an insulating layer 114 is formed on the patterned first electrode layer 110', and covers the whole substrate 100. In FIG. 2H, a second electrode layer 116 (M2) and a photoresist 118 are formed in sequence on the insulating layer 114, in which the photoresist 118 is a negative photoresist. After that, the photoresist 118 is exposed by backside exposure with the patterned mask layer 102' as a mask, so as to remove the photoresist 118 covered by the patterned mask layer 102' in FIG. 2H, thus forming a patterned photoresist 118' as shown in FIG. 2I.

Afterward, as shown in FIG. 2J, the exposed second electrode layer 116 is removed by backside exposure with the patterned photoresist 118' as a mask, thus forming a patterned second electrode layer 116'. In FIG. 2K, a photoresist 120 is formed on the patterned second electrode layer 116'. Then, as shown in FIG. 2L, the photoresist 120 is exposed by a mask 122, so as to from a patterned photoresist 120' as shown in FIG. 2M.

Thereafter, the exposed patterned second electrode 116' is removed by using the patterned photoresist 120' as a mask, so as to form a source 124 and a drain 126 as shown in FIG. 2N. FIG. 2P is a top view of the transistor fabricated by the above process.

Then, a polymer layer can be coated as a passivation layer of the organic or inorganic TFT. The passivation layer of the OTFT can a hydrophilic polymer, a hydrophilic and hydrophobic double-layered polymer, or a passivation layer mixed with organic and inorganic material. The mentioned is the same as the common technology, so the details will not be described herein again.

Figure 7A:
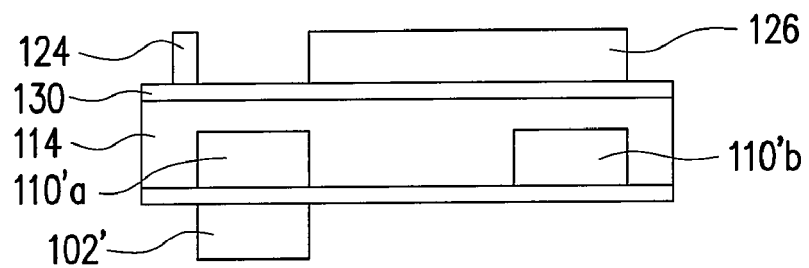
FIG. 7A shows a transistor structure with a semiconductor layer.

Moreover, in the above transistor structure, in addition to the gate, the source and the drain, a semiconductor layer can be further added. FIG. 7A is a schematic diagram showing such structure, which is a variation example of the transistor structure shown in FIG. 2N. The transistor structure of FIG. 7A is a bottom gate/top contact structure. As shown in FIG. 7A, after the insulating layer 114 is formed, a semiconductor layer 130 is formed on the insulating layer 114. Usually, the semiconductor layer 130 can also be referred to as an active layer. The semiconductor layer is mainly used to electrically connect the subsequently formed source 124 and the drain 126. The material of the semiconductor layer 130 is, for example, an organic or inorganic material, and the fabrication method thereof is, for example, vacuum fabrication (such as evaporation) or solution fabrication (such as spin coating or printing).

Moreover, in the above embodiment, the bottom gate/top contact structure is illustrated as an example, and other structures can also be adopted in the present invention, such as a top gate/bottom contact structure, a bottom gate/bottom contact structure, and a top gate/top contact structure. The two variation embodiments are described below.

Figure 7B:
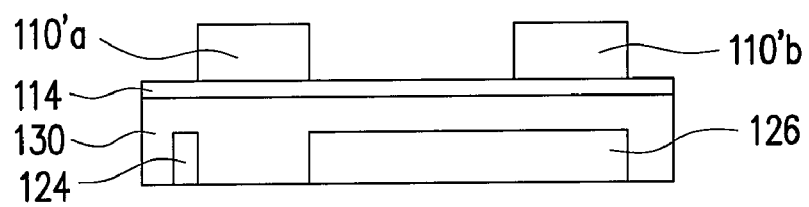
FIG. 7B shows a transistor structure of a variation embodiment with a top gate/bottom contact and a semiconductor layer structure.

FIG. 7B shows a transistor structure with a top gate/bottom contact structure. In addition, for the convenience of illustration, the numerals used here only represent the components identical or similar to those of the above embodiment, but do not necessarily mean having the same positions. As shown in FIG. 7B, after the source 124 and the drain 126 are formed, the semiconductor layer 130 is formed thereon. Next, the insulating layer 114 is formed on the semiconductor layer 130. Then, the gate 110'a is formed on the insulating layer 114. The fabrication method is basically the same as that of the above embodiment, and only the step sequence is slightly modified. Those skilled in the art can make suitable modification according to the above implementation, and the details will not be described herein again. Similarly, the semiconductor layer 130 is used to electrically connect the source 124 and the drain 126.

Figure 7C:
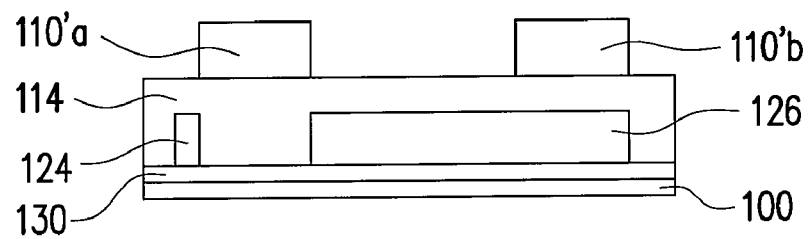
FIG. 7C shows a transistor structure of a variation embodiment with a top gate/top contact and a semiconductor layer structure.

FIG. 7C shows a transistor structure with a top gate/top contact structure. As shown in FIG. 7C, after the semiconductor 130 is formed, the source 124 and the drain 126 are formed thereon. Next, the insulating layer 114 is formed on the source 124 and the drain 126. Then, the gate 110'a is formed on the insulating layer 114. The fabrication method is basically the same as that of the above embodiment, and only the step sequence is slightly modified. Those skilled in the art can make suitable modification according to the above implementation, and the details will not be described herein again. Similarly, the semiconductor layer 130 is used to electrically connect the source 124 and the drain 126.

The Second Embodiment

Figure 3A:
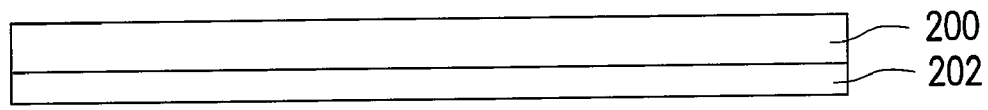
FIGS. 3A to 3K are schematic views of the fabrication flow of the TFT according to a second embodiment of the present invention.

Next, application examples of applying the method of the present invention to the gate and source/drain with a comb structure are illustrated. FIGS. 3A to 3K are schematic fabrication flow diagrams of the TFT according to the second embodiment of the present invention. FIG. 3P is a top view of the TFT according to the second embodiment of the present invention. FIGS. 4A to 4D are plan views corresponding to the steps of FIGS. 3A to 3K.

Figure 3B:
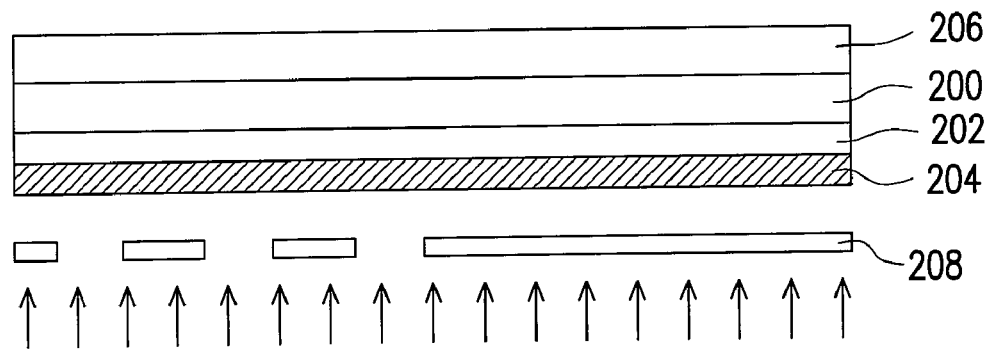
Figure 3C:
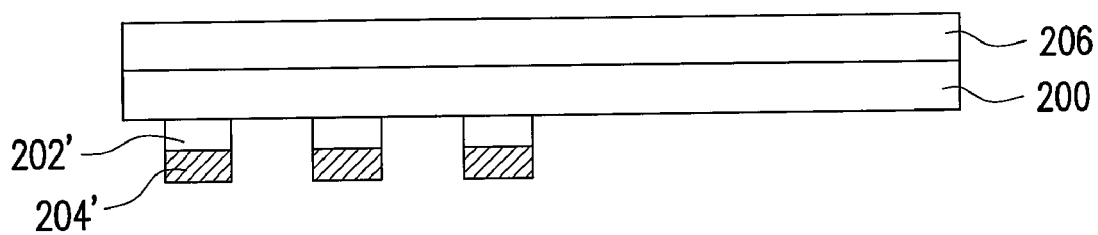
Figure 3D:
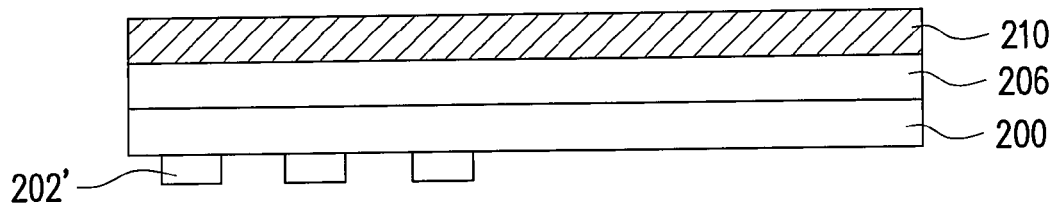
Figure 3E:
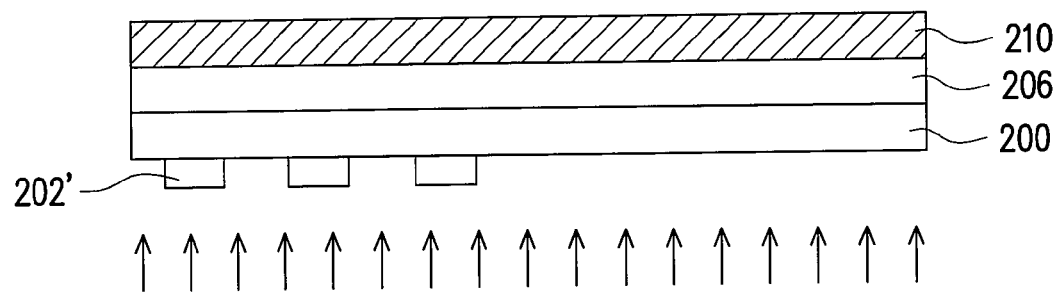
Figure 4A:
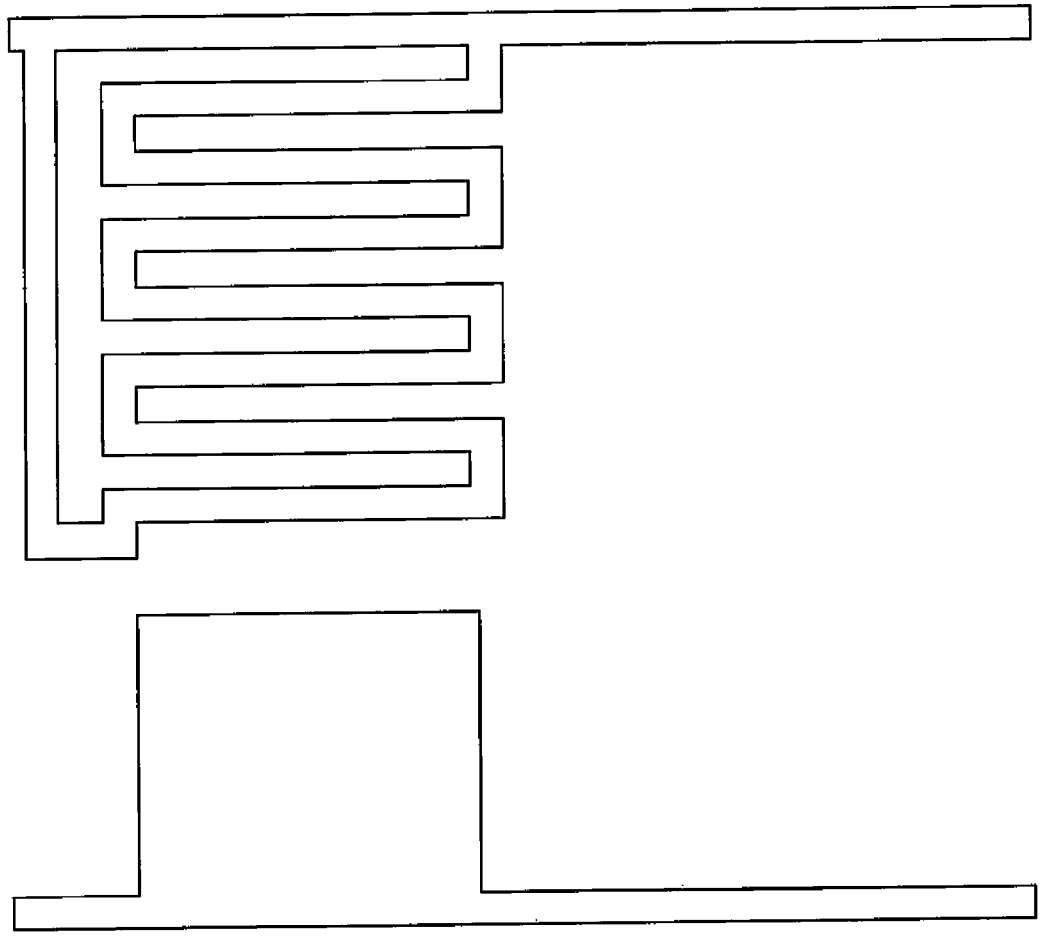
FIGS. 4A to 4D are plan views corresponding to the steps of FIGS. 3A to 3K.

As shown in FIG. 3A, a substrate 200 having a first surface as the backside and a second surface opposite to the backside is provided. A mask layer 202, for example made of the chromium material, is formed on the first surface of the substrate 200. Then, as shown in FIG. 3B, a photoresist 204 is formed on the mask layer 202, and a first electrode layer 206 (M1) is formed on the substrate 200. Next, the photoresist 204 is patterned by backside exposure with a mask 208, so as to make the photoresist 204 become the pattern shown in FIG. 3C. Afterward, as shown in FIGS. 3D and 3E, the exposed mask layer 202 is removed by using a patterned photoresist layer 204' as a mask, so as to form a patterned mask layer 202'. The plan view of the patterned mask layer 202' is shown in FIG. 4A, including patterns of the gate and the capacitor electrode, in which the gate pattern of this embodiment has a comb structure.

Figure 3F:
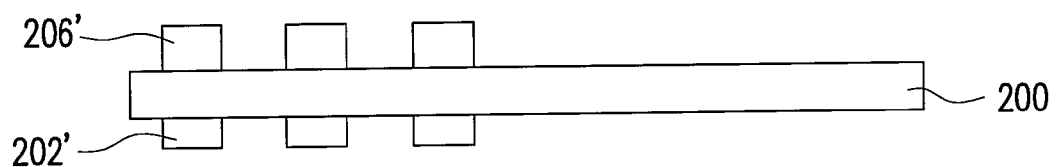

As shown in FIG. 3E, the photoresist 210 is patterned by backside exposure with the patterned mask layer 202' as a mask. Then, the patterned photoresist (not shown) is used to remove the exposed first electrode layer 206, so as to form a patterned first electrode layer 206' as shown in FIG. 3F, which comprises the gate of the transistor and the capacitor electrode.

Figure 3G:
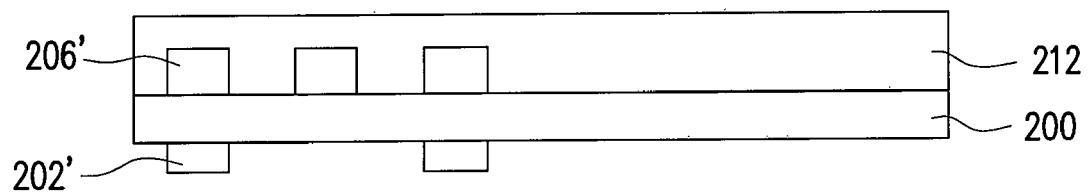
Figure 3H:
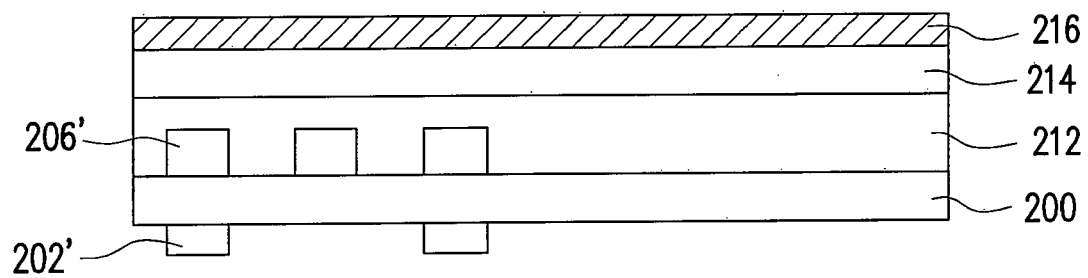
Figure 3I:
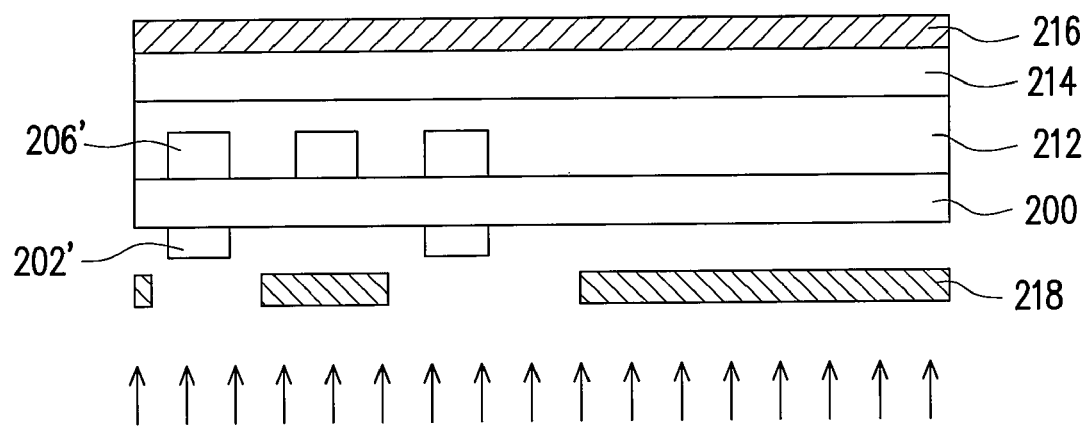
Figure 3J:
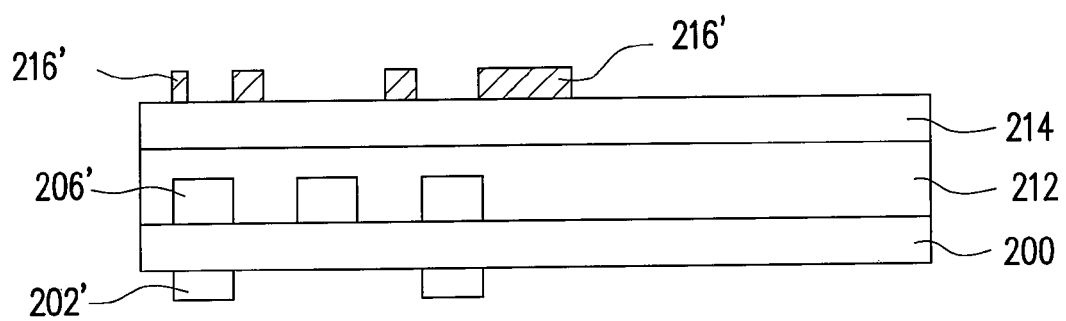
Figure 3K:
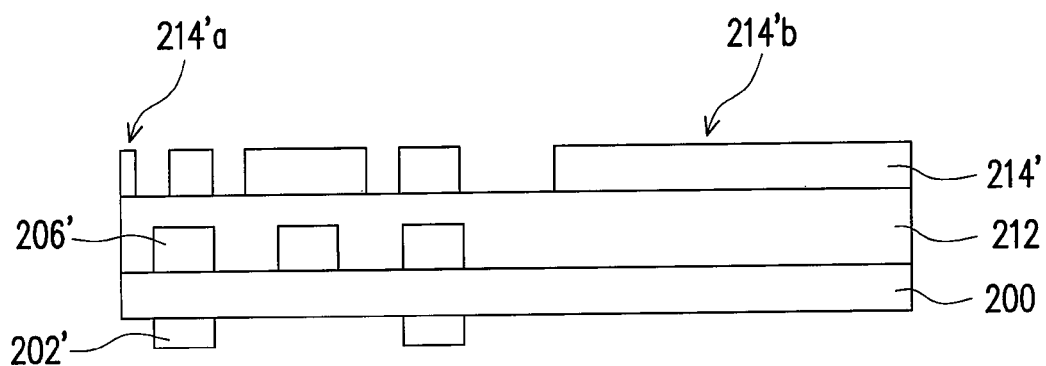
Figure 4B:
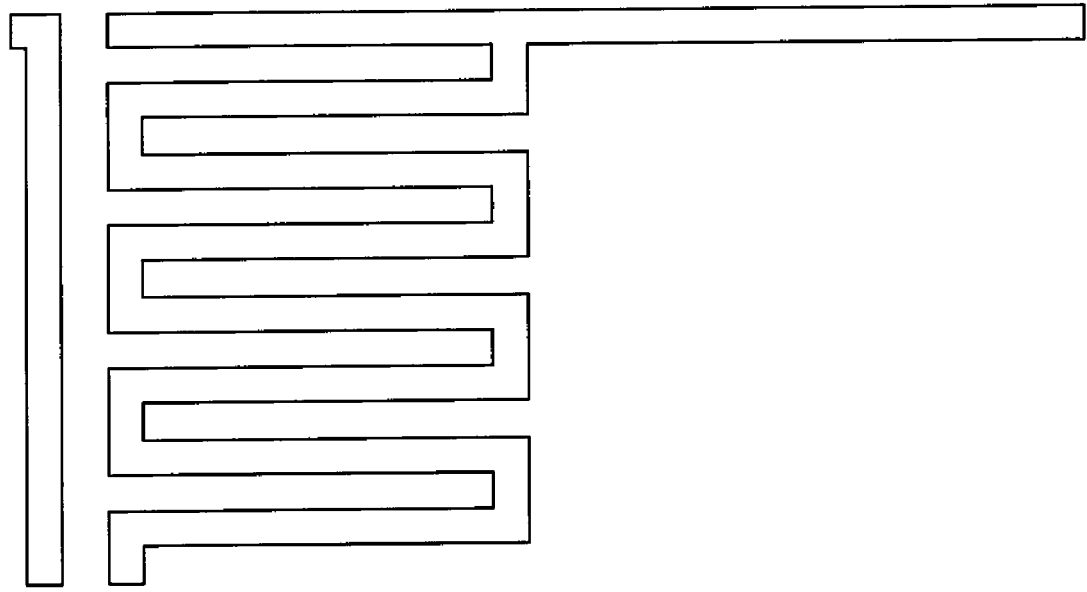
Figure 4B:
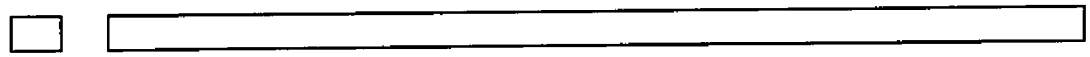
Figure 4C:
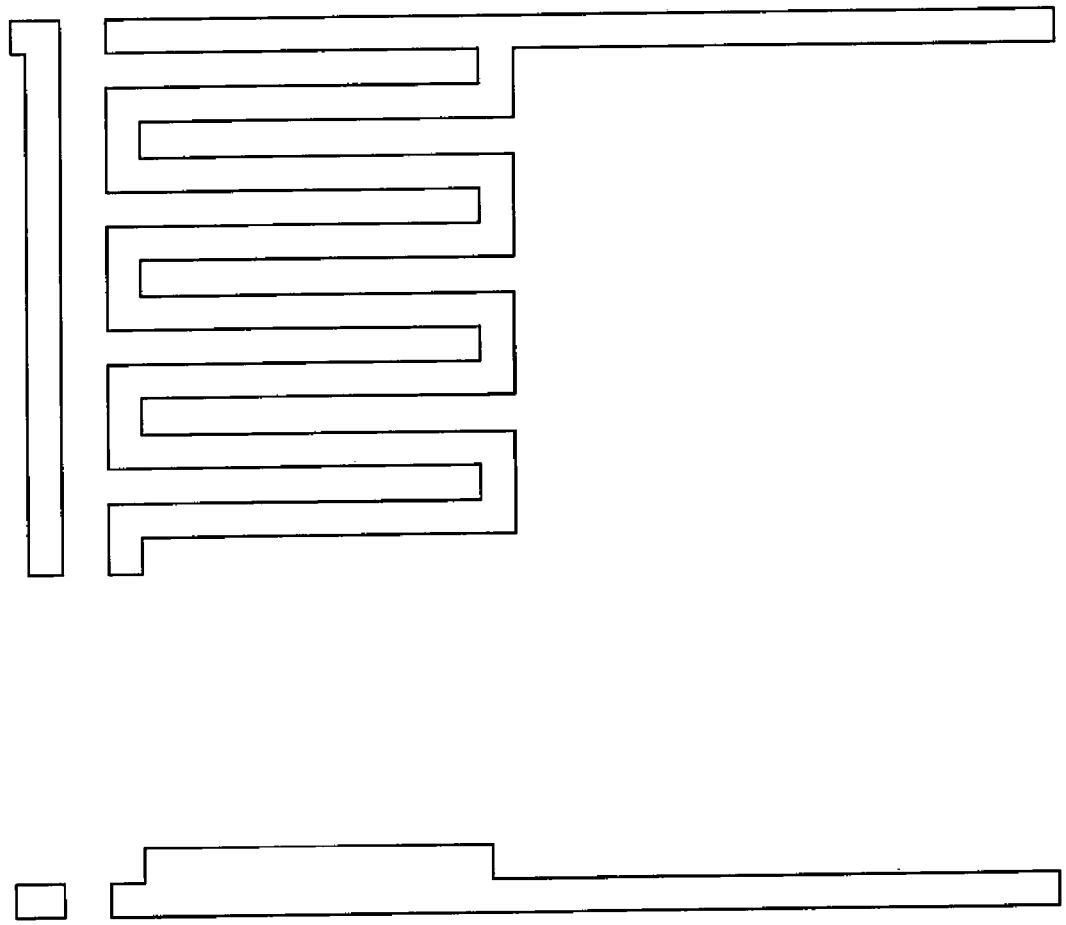
Figure 4D:
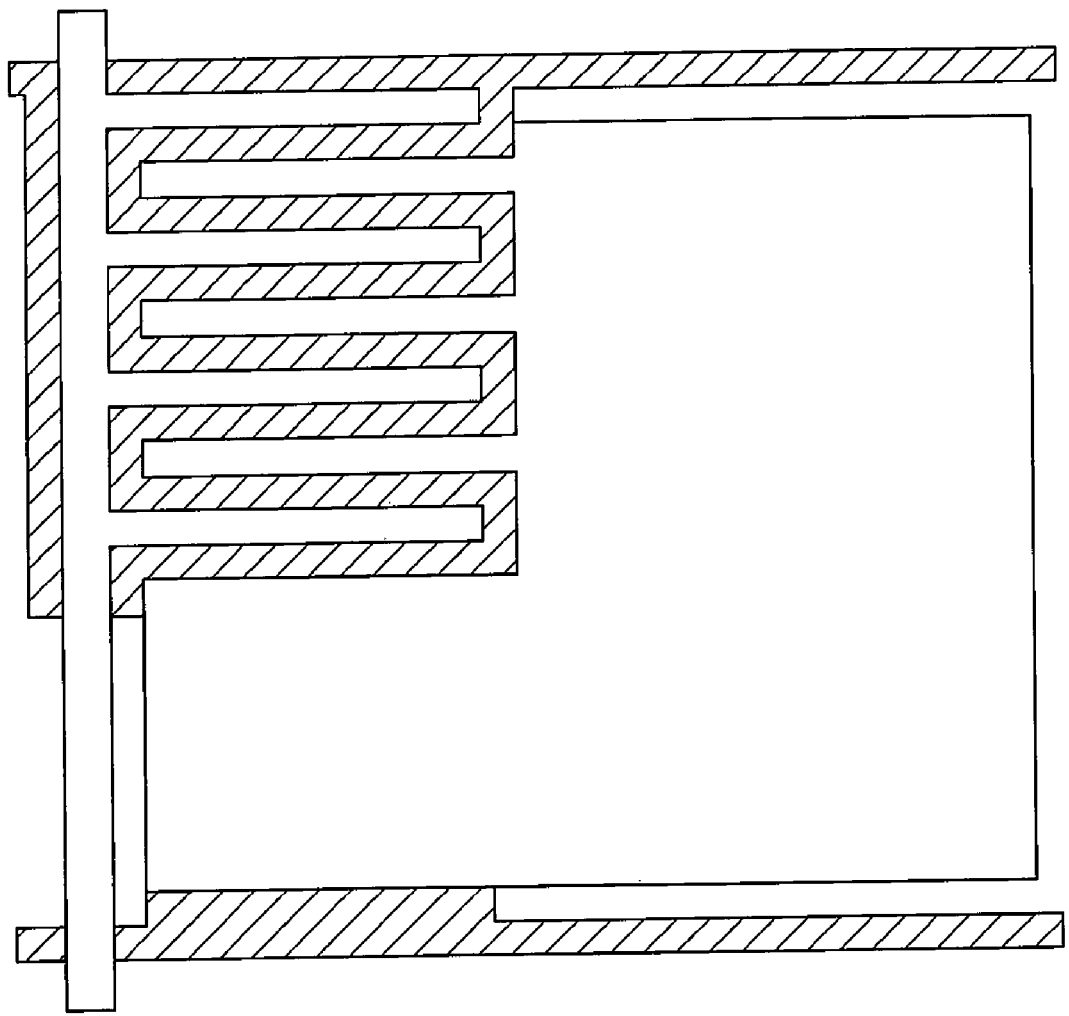

Thereafter, as shown in FIG. 3G an insulating layer 212 is formed on the whole substrate 200 to cover the whole patterned first electrode layer 206'. Moreover, the patterned mask layer 202' is re-defined to have a top view as shown in FIG. 4B. Then, as shown in FIG. 3H, a second electrode layer 214 and a photoresist 216 are formed in sequence on the insulating layer 212. Here, the second electrode layer 214 is patterned to form the source and drain patterns as shown in FIG. 4C. Next, as shown in FIGS. 3I and 3J, a mask 218 is disposed on the backside of the substrate 200. The mask 218 and the redefined mask layer 202' are used as a mask to perform backside exposure onto the photoresist 216, so as to pattern the photoresist 216 into a patterned photoresist 216'. Here, the photoresist 216 is a negative photoresist. Afterward, as shown in FIG. 3J, the exposed second electrode layer is removed by using the patterned photoresist 216' as a mask, so as to form the patterning in FIG. 3K, i.e., a source 214'a and a drain 214'b. FIG. 4D is a top view of the patterned first electrode layer and the patterned second electrode layer.

Figure 5A:
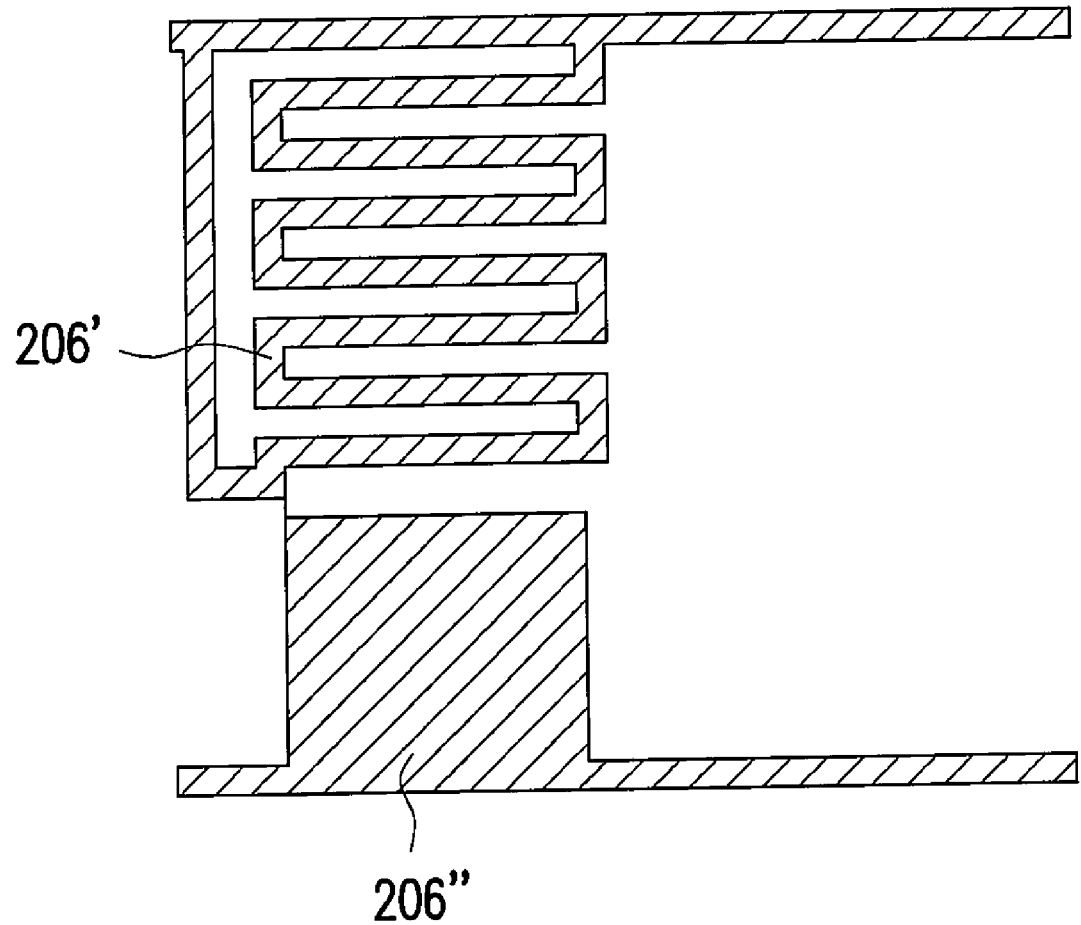
FIGS. 5A to 5C are top views of the transistor according to the second embodiment.
Figure 5B:
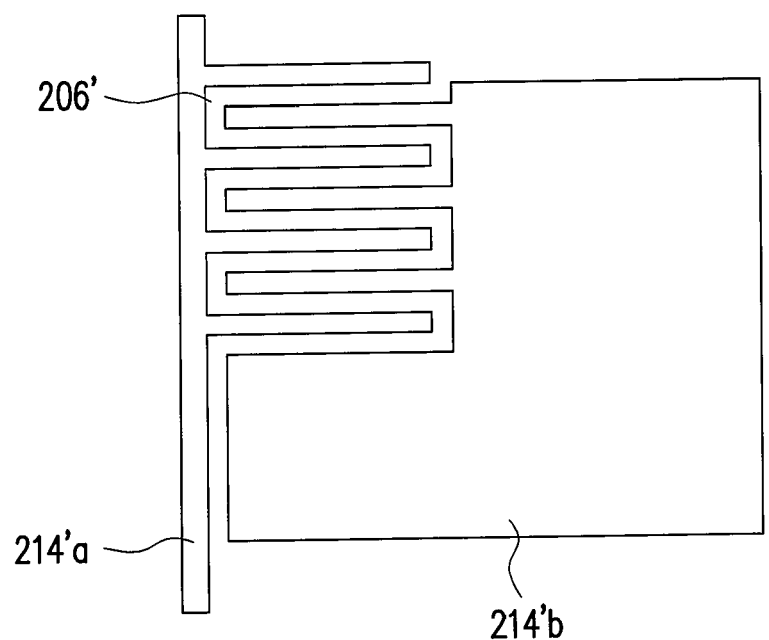
Figure 5C:
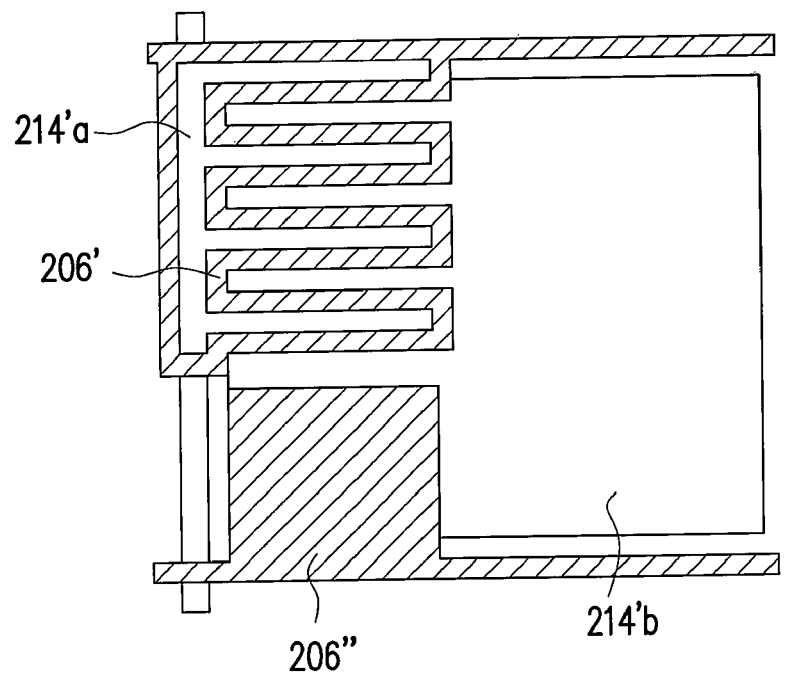

FIGS. 5A, 5B, and 5C are top views of the transistor according to the second embodiment. The gate pattern 206' shown in FIG. 5A has a comb structure (the first electrode layer). FIG. 5B shows the patterns of the source 214'a and the drain 214'b (the second electrode layer), which can be self-aligned with the comb pattern of the gate 206'. FIG. 5C further shows a capacitor electrode 206" connected to the drain 214'b. In the above comb electrode structure, the multi-electrode design can increase the aspect ratio of the element.

After that, similar to the first embodiment, a passivation layer of the organic or inorganic TFT can be coated, in which the passivation can be made of a hydrophilic polymer, a hydrophilic and hydrophobic double-layered polymer, or a passivation layer mixed with organic and inorganic material.

Figure 6A:
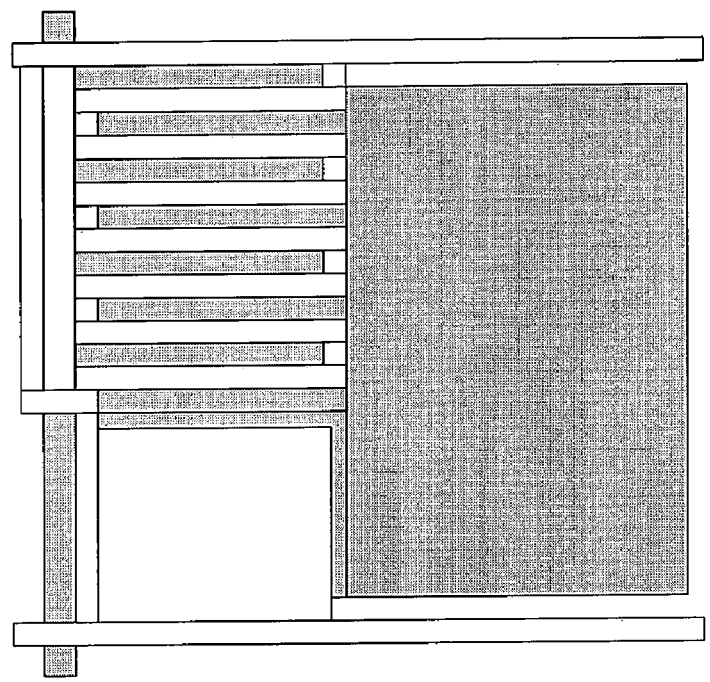
FIGS. 6A and 6B show different gate structures of the second embodiment.
Figure 6B:
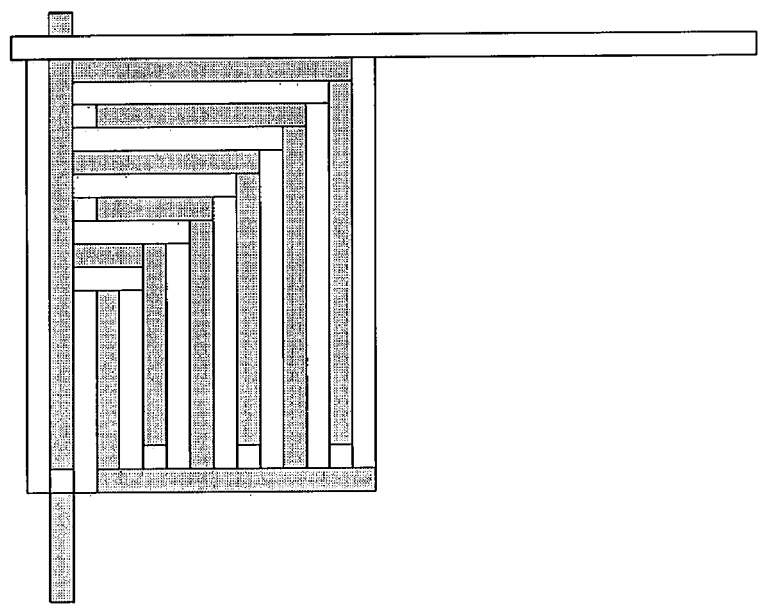

FIGS. 6A and 6B show different gate structures of the second embodiment. The present invention can be applied to various gate structures, and the patterns of the gate, the source, and the drain are not particularly restricted.

In view of the above, according to the description of the above embodiments, of the present invention, the source and the drain are self-aligned with the gate by forming the mask layer on the backside of the substrate and using backside exposure without causing overlap to generate a parasitic capacitance effect. The above method is more effective for a structure with a complicated gate shape, for example, the comb gate structure in the second embodiment.

Moreover, when a plastic substrate or a flexible substrate is adopted, and when the substrate is deformed by expansion or contraction during the fabrication process, the mask layer pattern disposed on the backside of the substrate is also deformed accordingly. Further, the subsequent gate and source/drain are still patterned based on the mask layer pattern on the backside of the substrate, and therefore, the source and drain remain aligned with the gate. Therefore, the process yield is increased.

In summary, the method or the structure of the present invention can increase the alignment accuracy, so as to increase the process yield, improve the backlight utilization of an LCD, achieve preferred element characteristics, reduce the substrate cost, and alleviate the difficulty in fabricating a shadow mask.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A thin film transistor (TFT) structure, comprising:
   a substrate, having a first surface and a second surface opposite to each other, wherein the first surface has a patterned mask layer thereon;
   a patterned first electrode layer, disposed on the second surface, having a gate portion and a capacitor electrode portion, wherein the patterned first electrode layer and the patterned mask layer are disposed on two opposite sides of the substrate;
   a patterned second electrode layer, disposed on the second surface, having a source and a drain, wherein the patterned second electrode layer is self-aligned with the patterned first electrode layer by exposing the first surface through using the patterned mask layer as a mask; and
   an insulating layer, disposed between the patterned first electrode layer and the patterned second electrode layer.

2. The TFT structure of claim 1, wherein the patterned second electrode layer is disposed on the insulating layer.

3. The TFT structure of claim 2, further comprising a semiconductor layer, disposed on the patterned second electrode layer, for electrically connecting the source and the drain.

4. The TFT structure of claim 2, further comprising a semiconductor layer, disposed between the insulating layer and the patterned second electrode layer, for electrically connecting the source and the drain.

5. The TFT structure of claim 1, wherein the patterned first electrode layer is disposed on the insulating layer.

6. The TFT structure of claim 5, further comprising a semiconductor layer, disposed between the substrate and the patterned second electrode layer, for electrically connecting the source and the drain.

7. The TFT structure of in claim 5, further comprising a semiconductor layer, disposed between the insulating layer and the patterned second electrode layer, for electrically connecting the source and the drain.

8. The TFT structure of claim 1, wherein the substrate is a plastic substrate or a flexible substrate.

9. The TFT structure of claim 1, wherein the mask layer is a chromium layer or an opaque metal layer.

10. The TFT structure of claim 1, wherein the first surface of the substrate is the backside or the front side of the substrate.

11. A thin film transistor (TFT) pixel structure, comprising:
    a substrate, having a first surface and a second surface opposite to each other, wherein the first surface has a patterned mask layer thereon;
    a patterned first electrode layer, disposed on the second surface, and having a gate portion, wherein the patterned first electrode layer and the patterned mask layer are disposed on two opposite sides of the substrate;
    a patterned second electrode layer, disposed on the second surface, having a source and a drain, wherein the patterned second electrode layer is self-aligned with the patterned first electrode layer by exposing the first surface through using the patterned mask layer as a mask; and
    an insulating layer, disposed between the patterned first electrode layer and the patterned second electrode layer.

12. The TFT pixel structure of in claim 11, wherein the patterned second electrode layer is disposed on the insulating layer.

13. The TFT pixel structure of claim 12, further comprising a semiconductor layer, disposed on the patterned second electrode layer, for electrically connecting the source and the drain.

14. The TFT pixel structure of claim 12, further comprising a semiconductor layer, disposed between the insulating layer and the patterned second electrode layer, for electrically connecting the source and the drain.

15. The TFT pixel structure of claim 11, wherein the patterned first electrode layer is disposed on the insulating layer.

16. The TFT pixel structure of claim 15, further comprising a semiconductor layer, disposed between the substrate and the patterned second electrode layer, for electrically connecting the source and the drain.

17. The TFT pixel structure of claim 15, further comprising a semiconductor layer, disposed between the insulating layer and the patterned second electrode layer, for electrically connecting the source and the drain.

18. The TFT pixel structure of claim 11, wherein the substrate is a plastic substrate or a flexible substrate.

19. The TFT pixel structure of claim 11, wherein the mask layer is a chromium layer or an opaque metal layer.

20. The TFT pixel structure of claim 11, wherein the first surface of the substrate is the backside or the front side of the substrate.

* * * * *